United States Patent
Timm et al.

(10) Patent No.: US 10,222,398 B2
(45) Date of Patent: Mar. 5, 2019

(54) ACTIVE PROBE ADAPTER

(71) Applicant: Keysight Technologies, Inc., Minneapolis, MN (US)

(72) Inventors: Daniel P Timm, Colorado Springs, CO (US); Bob Snow, Colorado Springs, CO (US); Hao Chie Ong, Penang (MY); Massharudin Bin Su, Penang (MY); Karn Hwa Lau, Penang (MY); Muhammad Ilyas Bin Abdul Gafoor, Penang (MY); Chong Ching Lee Chin, Penang (MY)

(73) Assignee: Keysight Technologies, Inc., Santa Rosa, CA (US)

( * ) Notice: Subject to any disclaimer, the term of this patent is extended or adjusted under 35 U.S.C. 154(b) by 349 days.

(21) Appl. No.: 14/684,423

(22) Filed: Apr. 12, 2015

(65) Prior Publication Data
US 2016/0299171 A1 Oct. 13, 2016

(51) Int. Cl.
*G01R 1/04* (2006.01)
*G01R 3/00* (2006.01)
*G01R 1/067* (2006.01)
*G01R 31/28* (2006.01)

(52) U.S. Cl.
CPC .......... *G01R 1/0408* (2013.01); *G01R 1/0416* (2013.01); *G01R 1/06711* (2013.01); *G01R 1/06772* (2013.01); *G01R 3/00* (2013.01); *G01R 31/2889* (2013.01)

(58) Field of Classification Search
CPC .. G01R 1/06711; G01R 3/00; G01R 1/06772; G01R 31/2889; G01R 1/0416

USPC ...................................................... 324/755.02
See application file for complete search history.

(56) References Cited

U.S. PATENT DOCUMENTS

| | | | | |
|---|---|---|---|---|
| 5,939,875 A * | 8/1999 | Felps | ................... | G01R 1/0416 324/115 |
| 6,447,339 B1 * | 9/2002 | Reed | ...................... | H01R 31/06 439/289 |
| 6,823,283 B2 * | 11/2004 | Steger | ................... | G01D 9/005 702/127 |
| 8,438,524 B1 * | 5/2013 | Kohli | .................. | G06F 17/5068 716/120 |

(Continued)

OTHER PUBLICATIONS

M. J. Stora and D. Droste, "IEEE-P1552 packaging architecture for computer-busboard systems (PACS)," 2001 IEEE Autotestcon Proceedings. IEEE Systems Readiness Technology Conference. (Cat. No. 01CH37237), Valley Forge, PA, 2001, pp. 38-52.*

(Continued)

*Primary Examiner* — Christopher P McAndrew

(57) ABSTRACT

An active probe adapter adapts an active probe to a PXI instrumentation module. The active probe adapter includes a first module interface (MI) connector on a first side of the active probe adapter. The first MI connector is configured to connect to a corresponding interface connector of the PXI instrumentation module. The active probe adapter further includes a plurality of probe pads on a second side of the active probe adapter opposite to the first side. The plurality of probe pads is configured to interface with an active probe employed with the PXI instrumentation module. The active probe adapter may include a second MI connector on the active probe first side configured to connect to a PXI power module and provide power to the active probe.

5 Claims, 3 Drawing Sheets

(56) References Cited

U.S. PATENT DOCUMENTS

| | | | |
|---|---|---|---|
| 2003/0040881 A1* | 2/2003 | Steger | G01D 9/005 |
| | | | 702/123 |
| 2009/0220013 A1* | 9/2009 | Butts | H01R 13/6581 |
| | | | 375/257 |
| 2011/0111619 A1* | 5/2011 | Stowers | H01R 12/724 |
| | | | 439/359 |
| 2013/0158906 A1* | 6/2013 | Guo | G01R 1/133 |
| | | | 702/60 |
| 2013/0158907 A1* | 6/2013 | Guo | G01R 21/133 |
| | | | 702/60 |

OTHER PUBLICATIONS

E. B. Kushnick, "The PXI carrier: a novel approach to ATE instrument development," IEEE International Conference on Test, 2005., Austin, TX, 2005, pp. 7 pp. 897.*

* cited by examiner

ACTIVE PROBE ADAPTER

CROSS-REFERENCE TO RELATED APPLICATIONS

N/A

STATEMENT REGARDING FEDERALLY SPONSORED RESEARCH OR DEVELOPMENT

N/A

BACKGROUND

Test and measurement systems or more generally instrumentation platforms have traditionally been realized as stand-alone units that included instrumentation circuitry, a display and a user interface (i.e., buttons, knobs, etc.) in fixed configuration. For example, an oscilloscope may be available with a fixed number of test inputs (e.g., two input, four inputs, etc.) having a manufacturer determined set of defined capabilities (e.g., bandwidth and sensitivity). When a particular measurement task required a new mix of inputs or capabilities, it was often necessary to obtain a new instrumentation platform that was suited to the new input or capability mix. An alternative to the traditional instrumentation platform is the modular instrumentation platform that allows a test and measurement system to be customized in the field to meet requirements of a particular measurement task or set of tasks.

A popular modular instrumentation platform approach for realizing automation systems, electronic test and measurement systems, and related modular laboratory instruments is based on the so-called peripheral component interconnect (PCI) eXtensions for instrumentation (PXI) modular instrumentation architecture. The PXI modular instrumentation architecture offers an attractive, rugged, PC-based platform for providing instrumentation in a wide variety of test and measurement applications. For example, PXI instrumentation modules configured to accomplish a wide variety of test and measurement functions include, but are not limited to, one or more of oscilloscope functions and digitizer functions. Moreover, a single PXI chassis can be configured with a set of PXI instrumentation modules and then quickly and economically reconfigured with different PXI instrumentation modules when the measurement tasks change.

Unfortunately, while providing a high degree of modularity and reconfigurability, the PXI instrumentation module-based platforms may present some practical limitations in terms of applicability. For example, many active probes that may be used require more power than is typically available from a PXI instrumentation module. Further, many probes, especially existing active probes, often have an interface or form factor that is not compatible with certain PXI instrumentation module size constraints, for example.

BRIEF SUMMARY

In some embodiments, an active probe adapter is provided. The active probe adapter comprises a first module interface (MI) connector on a first side of the active probe adapter. The first MI connector is configured to connect to a corresponding interface connector of a PXI instrumentation module. The active probe adapter further comprises a plurality of probe pads on a second side of the active probe adapter opposite to the first side. The plurality of probe pads is configured to interface with an active probe employed with the PXI instrumentation module. Further, the active probe adapter is configured to be installed between the active probe and a faceplate of the PXI instrumentation module.

In some embodiments, a PXI instrumentation system employing an active probe is provided. The PXI instrumentation system comprises a PXI instrumentation module in a PXI chassis. The PXI instrumentation system further comprises a PXI power module adjacent to the PXI instrumentation module in the PXI chassis. The PXI power module is configured to provide power to the active probe. The PXI instrumentation system further comprises an active probe adapter configured to adapt a form factor of and provide an electrical interface between the active probe and one or both of the PXI instrumentation module and the PXI power module.

In some embodiments, a method of adapting an active probe to a PXI instrumentation module is provided. The method of adapting an active probe to a PXI instrumentation module comprises providing an active probe adapter that is substantially planar and that has a first module interface connector on a first side and a plurality of probe pads on a second side opposite to the first side of the active probe adapter. The method of adapting an active probe to a PXI instrumentation module further comprises connecting the first module interface connector of the active probe adapter to a corresponding interface connector of the PXI instrumentation module. The method of adapting an active probe to a PXI instrumentation module further comprises connecting the active probe to a test signal input connector of the PXI instrumentation module. Connecting the active probe further comprises contacting pins of the active probe to the plurality of probe pads of the active probe adapter.

BRIEF DESCRIPTION OF THE DRAWINGS

Various features of embodiments and examples in accordance with the principles described herein may be more readily understood with reference to the following detailed description taken in conjunction with the accompanying drawings, where like reference numerals designate like structural elements, and in which.

Figure 1A:
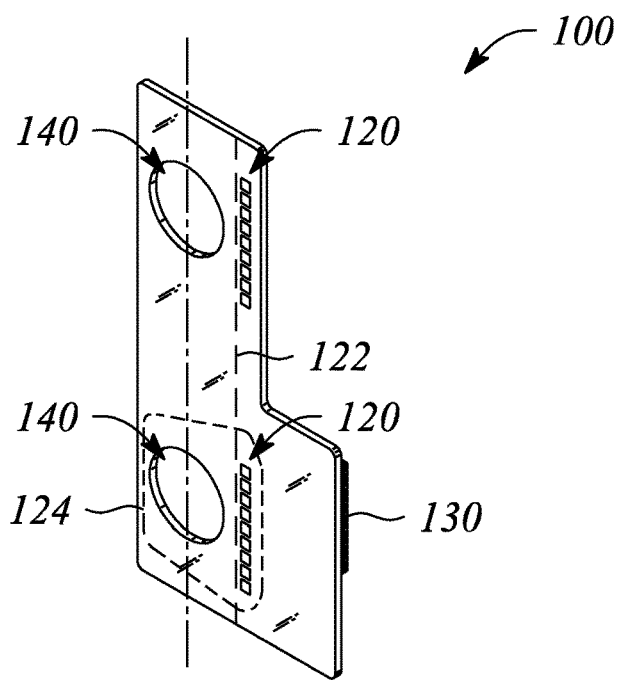
FIG. 1A illustrates a perspective view of an active probe adapter in an example, according to an embodiment consistent with the principles described herein.

Certain examples and embodiments have other features that are one of in addition to and in lieu of the features illustrated in the above-referenced figures. These and other features are detailed below with reference to the above-referenced figures.

DETAILED DESCRIPTION

Embodiments and examples consistent with the principles described herein provide an active probe adapter used with a modular test and measurement platform or, more generally, an instrumentation platform. In particular, embodiments of the active probe adapter are configured to provide an interface between an active probe and an instrumentation module based on the PCI eXtensions for instrumentation (PXI) modular instrumentation architecture (i.e., a PXI instrumentation module). The PXI instrumentation module may include, but is not limited to, one or both of a PXI oscilloscope module and a PXI digitizer module. In addition, various embodiments of the active probe adapter according to the principles described herein may also provide an interface between an active probe and a PXI power module configured to provide power to the active probe. The PXI power module may reside adjacent to the PXI instrumentation module in a PXI chassis, for example. As such, the active probe adapter may facilitate accommodation of different form factors of various modules and probes for use together. In particular, the active probe adapter may facilitate the use of existing, non-PXI instrumentation module-specific, active probes with a PXI instrumentation module by one or both of adapting an interface of the active probe to the PXI instrumentation module and providing sufficient power to the active probe using the PXI power module.

Herein, an 'active probe' is broadly defined as a probe or similar device used with an instrumentation system that employs an external power source or supply. For example, the active probe may be an oscilloscope probe that includes active circuitry such as, but not limited to, an amplifier that uses power from a source external to the active probe. On the other hand, a 'passive probe' by definition is a probe that includes only passive circuitry and is capable of operating without an external power source.

Further, as used herein, the article 'a' is intended to have its ordinary meaning in the patent arts, namely 'one or more'. For example, 'a connector' means one or more connectors and as such, 'the connector' means 'the connector(s)' herein. Also, any reference herein to 'top', 'bottom', 'upper', 'lower', 'up', 'down', 'front', 'back', 'first', 'second', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount within a range of about 51% to about 100%, for example. Moreover, examples herein are intended to be illustrative only and are presented for discussion purposes and not by way of limitation.

In accordance with some embodiments of the principles described herein, an active probe adapter is provided to be used with an instrumentation platform (e.g., a test and measurement system or apparatus). In particular, embodiments of the active probe adapter are configured to provide an interface between an active probe and an instrumentation module based on the PCI eXtensions for instrumentation (PXI) modular instrumentation architecture (i.e., a PXI instrumentation module). For example, an active probe having a form factor or interface configuration that is wider than the PXI instrumentation module may be accommodated using the active probe adapter. Further, the active probe adapter may facilitate the use of an external power source (i.e., a power source external to the PXI instrumentation module) to power to the active probe, according to some embodiments. The external power source may be a PXI power module for example.

Figure 1B:
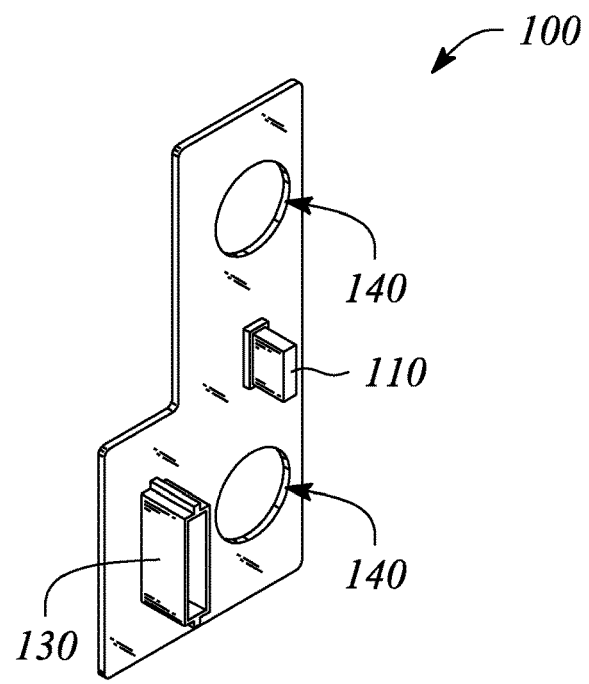
FIG. 1B illustrates another perspective view of the active probe adapter of FIG. 1A in an example, according to an embodiment consistent with the principles described herein.

FIG. 1A illustrates a perspective view of an active probe adapter 100 in an example, according to an embodiment consistent with the principles described herein. FIG. 1B illustrates another perspective view of the active probe adapter 100 of FIG. 1A in an example, according to an embodiment consistent with the principles described herein. In particular, FIG. 1A illustrates a front side or view and FIG. 1B illustrates a back side or view of the active probe adapter 100. According to various embodiments, the active probe adapter 100 may be used with substantially any PXI instrumentation module including, but not limited to, a PXI oscilloscope module or a PXI digitizer module. Further, the active probe adapter 100 is configured to be installed on the PXI instrumentation module and also to provide an interface between an active probe and the PXI instrumentation module, according to various embodiments. The provided interface may be one or both of a physical and an electrical interface, for example.

As illustrated, the active probe adapter 100 comprises a first module interface (MI) connector 110 (shown in FIG. 1B). The first MI connector 110 is on a first side of the active probe adapter 100 (i.e., back side, as illustrated), according to various embodiments. The first MI connector 110 is configured to connect to a corresponding or mating interface connector of a PXI instrumentation module (not illustrated in FIGS. 1A-1B). For example, the first MI connector 110 may be a multi-pin plug connector that is configured to plug into or mate with a mating multi-pin socket connector of the PXI instrumentation module. The mating multi-pin socket connector may be mounted in a faceplate of the PXI instrumentation module, for example. By way of example and not limitation, the first MI connector 110 may be a 14-circuit, Surface Mount, Board-to-Board Receptacle connector, part number 52465-1470 and the mating multi-pin socket connector may be a corresponding 14-circuit, Surface Mount, Board-to-Board Header connector, part number 53309-1470, both of which are products of Molex, Lisle, Ill. According to various embodiments, the first MI connector 110 is configured to communicate one or both of signals and power between the active probe adapter 100 and the PXI instrumentation module.

The active probe adapter 100 further comprises a plurality of probe pads 120 (shown in FIG. 1A). The plurality of probe pads 120 is on a second side of the active probe adapter 100 (i.e., front side, as illustrated). According to various embodiments, the plurality of probe pads 120 is configured to interface with an active probe (not illustrated) employed with the PXI instrumentation module. For example, a probe pad 120 of the plurality may comprise a conductive pad or patch on or in a surface of the active probe adapter 100. The probe pad 120 may be configured to receive and provide electrical contact with a pin of the active probe, for example. In some embodiments, the active probe pin may be a spring-loaded pin or similar contact such as, but not limited to, a pogo pin.

According to some embodiments, the probe pad 120 may include a hardened metallization in addition to a low resistance metallization that is configured to resist abrasion by the pogo pin or similar spring-loaded contact. In particular, the probe pad 120 may comprise gold plating on top of an underlying hardened metallized contact pad. Further, according to some embodiments, the probe pad 120 may be recessed in a surface of the active probe adapter 100 to help guide the active probe pin into positive contact with the probe pad 120. The recess may further help to insure that contact is maintained, for example by facilitating prevention of the active probe pin from slipping off of the probe pad 120, according to some embodiments.

As illustrated in FIG. 1A, the plurality of probe pads 120 comprises a linear array of the probe pads 120 including nine (9) separate probe pads 120, for example. The number, linear arrangement and spacing of the probe pads 120 of the plurality as illustrated in FIG. 1A may accommodate a model N2795A Active Probe, for example. The model N2795A Active Probe is a product of Keysight Technologies, Inc. of Santa Rosa, Calif., USA. Other examples of active probes that may be used with the active probe adapter 100 and specifically that may define various embodiments and configurations of the probe pad plurality include, but are not limited to, a model N2796A Active Probe, 2 GHz; and a model N2797A Extreme Temperature Active Probe, 1.5 GHz, all of which are also products of Keysight Technologies, Inc. Note however, while the plurality of probe pads 120 is illustrated as a 9-pad, linear array, the probe pads 120 of the plurality may be configured to accommodate virtually any pin configuration consistent with the active probe being accommodated, according to various embodiments, and still be within the scope of the principles described herein.

According to various embodiments, the plurality of probe pads 120 may be located at a distance from a centerline of the PXI instrumentation module that is greater than about one half of a width of the PXI instrumentation module faceplate. In other words, the plurality of probe pads 120 is located beyond an edge of the PXI instrumentation module to accommodate an active probe that is wider or at least that has a pin configuration that is wider than the PXI instrumentation module. A dash-dot line in FIG. 1A illustrates a location of the PXI instrumentation module centerline relative to the active probe adapter 100. In addition, a dashed line 122 in FIG. 1A illustrates a location of an edge of the PXI instrumentation module faceplate. An outline 124 (i.e., a closed dashed line) of an example active probe outline is also illustrated in FIG. 1A.

According to some embodiments (e.g., as illustrated in FIGS. 1A-1B), the active probe adapter 100 further comprises a second module interface (MI) connector 130. The second MI connector 130 is on the first side of the active probe adapter 100 (e.g., back side, as illustrated), according to various embodiments. The second MI connector 130 is configured to connect to a corresponding or mating interface connector of a PXI power module (not illustrated in FIGS. 1A-1B). The PXI power module is configured to be located adjacent to the PXI instrumentation module, according to some embodiments. For example, the second MI connector 130 may be a multi-pin socket connector that is configured to plug into or mate with a mating multi-pin plug connector (also not illustrated in FIGS. 1A-1B) of the PXI power module. The mating multi-pin pin connector may be mounted in or through a faceplate of the PXI power module, for example. By way of example and not limitation, the second MI connector 130 may be a 20-circuit, Connector-Socket Vertical SMT connector, part number ISMA-98505-14Y969 and the mating multi-pin plug connector may be a corresponding 20-circuit, Connector-Plug, Right-angle SMT connector, part number IMSA-9850B-14Y950, both of which are products of IRISO ELECTRONIC CO., LTD, of Yokohama, Kanagawa, Japan. The second MI connector 130 is configured to communicate power from the PXI power module to the active probe adapter 100 and therethrough to the active probe, according to various embodiments. The communicated power may be used to provide operational power to the active probe via the plurality of probe pads 120, for example.

As illustrated in FIGS. 1A-1B, the active probe adapter 100 may comprise a substrate such as, but not limited to, a planar substrate and may further comprise a through-hole 140 from the first side to the second side of the planar substrate of the active probe adapter 100, according to some embodiments. The through-hole 140 may be configured to accommodate and fit over a test signal input connector (not illustrated in FIGS. 1A-1B) of the PXI instrumentation module. Accommodating and fitting over the test signal input connector may facilitate connection of the active probe to the test signal input connector, for example.

In some embodiments, the planar substrate of the active probe adapter 100 may be a printed circuit board (PCB). For example, the active probe adapter 100 may be the PCB with the first and second MI connectors 110, 130 affixed to a backside of the PCB as surface-mount connectors. Further, the plurality of probe pads 120 may be formed in the PCB on the front side thereof and the through-hole may pass through the PCB, according to some embodiments. The PCB may further include circuitry (e.g., circuit traces) that interconnects the first MI connector 110, the plurality of probe pads 120, and the second MI connectors 130 to carry signals and power therebetween.

In other embodiments, the active probe adapter 100 may comprise a housing (e.g., a box) or similar structure with the first and second MI connectors 110, 130 mounted on a first side of the housing and the probe pads 120 being on a second side of the housing. The housing may further comprise circuitry to interconnect the first MI connector 110, the second MI connector 130 and the probe pads 120, for example. A printed circuit board may provide the interconnecting circuitry, for example.

According to some embodiments, a test signal input connector of the PXI instrumentation module comprises a BNC connector (see for example FIG. 2A, described below). Further, in some embodiments, the BNC connector may include the probe identification (ID) ring coaxially located at a base of the BNC connector adjacent to the PXI instrumentation module faceplate. When the active probe adapter 100 is installed against the PXI instrumentation module faceplate, a thickness of the active probe adapter or equivalently a PCB thereof may be less than a thickness of the probe ID ring, for example. That is, in some embodiments, a thickness of the PCB may be less than about a thickness of a probe ID ring of the test signal input connector or BNC connector. The PCB thickness may facilitate access to the probe ID ring by both the active probe and a passive probe used with the PXI instrumentation module.

In some embodiments of the principles described herein, a PXI instrumentation system employing an active probe is provided. FIG. 2A illustrates an exploded, perspective view of a PXI instrumentation system 200 in an example, according to an embodiment consistent with the principles described herein. FIG. 2B illustrates a perspective view of the PXI instrumentation system 200 of FIG. 2A in an unexploded configuration, according to an embodiment consistent with the principles described herein. The active probe is not illustrated in FIGS. 2A and 2B.

Figure 2A:
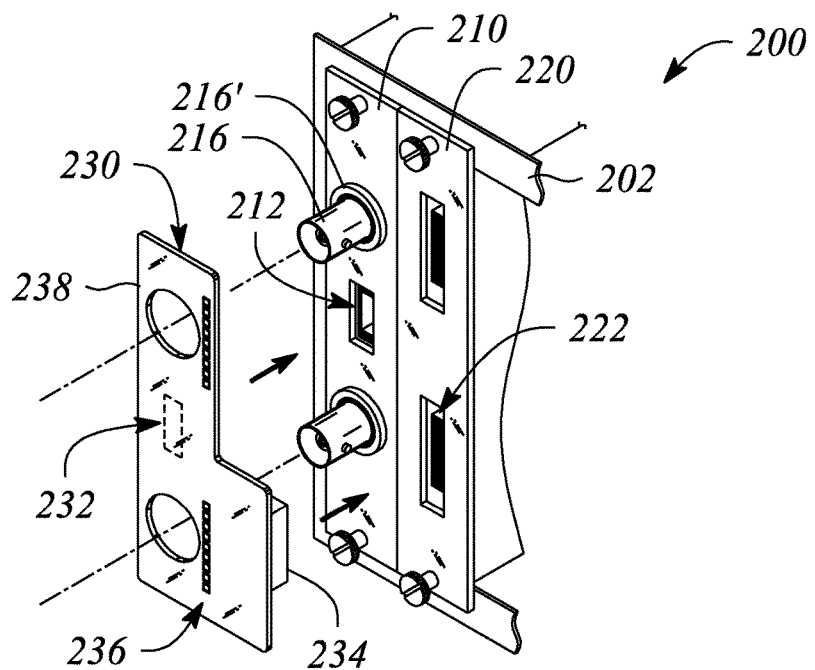
FIG. 2A illustrates an exploded, perspective view of a PXI instrumentation system in an example, according to an embodiment consistent with the principles described herein.
Figure 2B:
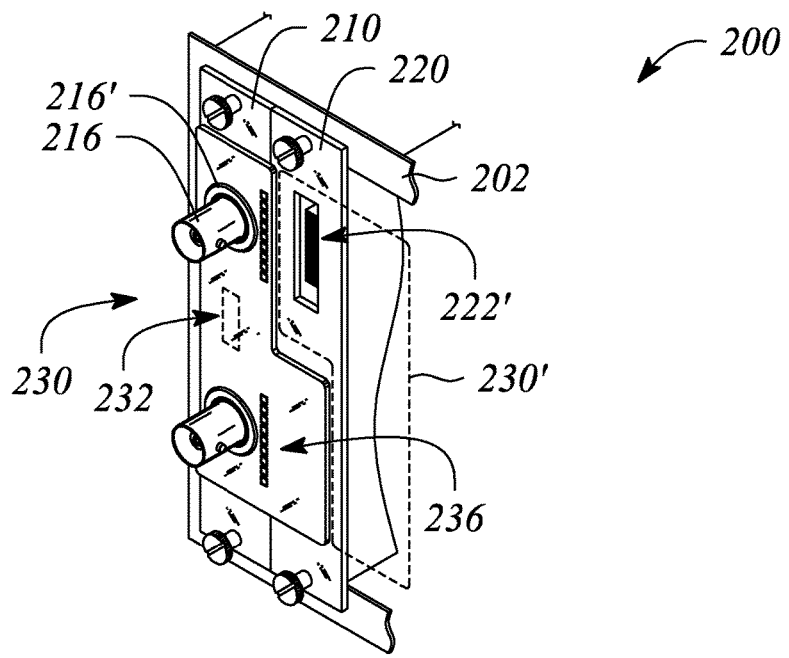
FIG. 2B illustrates a perspective view of the PXI instrumentation system of FIG. 2A in an unexploded configuration, according to an embodiment consistent with the principles described herein.

The PXI instrumentation system 200 illustrated in FIGS. 2A and 2B comprises a PXI instrumentation module 210. The PXI instrumentation module 210 is illustrated in partial rendering of a PXI chassis 202. The PXI instrumentation module 210 comprises interface connectors and access to the interface connectors that is provided through a PXI instrumentation module faceplate. According to some embodiments, the PXI instrumentation module 210 may be substantially similar to the PXI instrumentation module described above with respect to the active probe adapter 100. For example, the PXI instrumentation module 210 may comprise substantially any PXI instrumentation module including, but not limited to, a PXI oscilloscope module or a PXI digitizer module. Similarly, the active probe employed by the PXI instrumentation system 200 may be substantially any active probe that is used with the PXI instrumentation module 210 including, but not limited to, those active probes described above.

The PXI instrumentation system 200 illustrated in FIGS. 2A and 2B further comprises a PXI power module 220. The PXI power module 220 is adjacent to the PXI instrumentation module 210 in the PXI chassis 202, as illustrated. According to various embodiments, the PXI power module 220 is configured to provide power to the active probe. The PXI power module 220 comprises an interface connector and access to the interface connector that is provided through a PXI power module faceplate. According to some embodiments, the PXI power module 220 may be substantially similar to the PXI power module described above with respect to the active probe adapter 100.

According to various embodiments, the PXI instrumentation system 200 further comprises an active probe adapter 230. The active probe adapter 230 is configured to provide an interface between the active probe and one or both of the PXI instrumentation module 210 and the PXI power module 220, according to some embodiments. Providing the interface may include adapting a mechanical interface or form factor of the active probe and providing an electrical interface.

For example, the PXI instrumentation module 210 may be too narrow to accommodate certain active probes (e.g., existing active probes). Further, the PXI instrumentation architecture may not allow for sufficient or adequate power from the PXI instrumentation module 210 to support operation of certain active probes. The active probe adapter 230 may one or both of adapt the mechanical interface or a form factor (e.g., a pin location) of the active probe to the PXI instrumentation module 210 and provide power from the PXI power module 220 to support operation of the active probe (i.e., power the active probe). In some embodiments, the active probe adapter 230 is substantially similar to the active probe adapter 100, described above.

In particular, according to some embodiments, the active probe adapter 230 comprises a first module interface (MI) connector 232 on a first side (e.g., a back side) of the active probe adapter 230. A dashed rectangle in FIGS. 2A and 2B indicates a location of the first MI connector 232 which is hidden from view on the back side of the active prove adapter 230, as illustrated. In some embodiments (e.g., as illustrated in FIG. 2A), the active probe adapter 230 further comprises a second MI connector 234 on the first side of the active probe adapter 230. The first MI connector 232 is configured to connect to the PXI instrumentation module 210, e.g., at a corresponding interface connector 212 thereof. The second MI connector 234 is configured to connect to the PXI power module 220, e.g., at a corresponding interface connector 222 thereof. In particular, an arrow in FIG. 2A between the first MI connector 232 and the corresponding PXI instrumentation module interface connector 212 illustrates the connectability of these two connectors 232, 212. Similarly, an illustrated arrow between the second MI connector 234 and the corresponding PXI power module interface connector 222 illustrates the connectability of these two connectors 234, 222.

According to some embodiments, the first MI connector 232 and corresponding PXI instrumentation module interface connector 212 may be substantially similar to the first MI connector 110 and the corresponding PXI instrumentation module interface connector, respectively, described above with respect to the active probe adapter 100. Likewise, in some embodiments, the second MI connector 234 and the corresponding PXI power module interface connector 222 may be substantially similar to the second MI connector 130 and the corresponding PXI power module interface connector, respectively, described above with respect to the active probe adapter 100.

Further, according to various embodiments as illustrated in FIGS. 2A-2B, the active probe adapter 230 comprises a plurality of probe pads 236 on a second side (e.g. a front side) of the active probe adapter 230 opposite the first side. The plurality of probe pads 236 may be substantially similar to the plurality of probe pads 120 of the active probe adapter 100, described above. In particular, the plurality of probe pads 236 is configured to interface with the active probe, e.g., via a corresponding plurality of pins of the active probe that is configured to engage or contact the probe pads 236 of the plurality. Moreover, in some embodiments, the plurality of probe pads 236 are located at a distance from a centerline of the PXI instrumentation module 210 that is greater than about one half of a width of the faceplate of the PXI instrumentation module 210 in a direction toward the PXI power module 220 (e.g., as illustrated in FIG. 1A).

According to some embodiments, the active probe adapter 230 is a planar structure and further comprises a substrate 238 that is substantially planar. The substantially planar substrate 238 may be a printed circuit board (PCB), for example. The substrate 238 is configured to be sandwiched between the active probe and a faceplate of the PXI instrumentation module 210. FIG. 2A illustrates the active probe adapter 230 comprising the substantially planar substrate 238 as a PCB 238. Further, the active probe adapter 230 comprising the PCB 238 is positioned in FIG. 2B installed on the PXI instrumentation modules against the PXI instrumentation module faceplate. The positioning of the PCB 238 against faceplate facilitates sandwiching the active probe adapter 230 between the active probe and the faceplate, according to various embodiments.

In some embodiments (e.g., as illustrated in FIG. 2B), the PXI power module 220 may include another module interface connector 222'. The other module interface connector 222' is configured to facilitate connecting a second PXI instrumentation module (not illustrated) using another active probe adapter 230'. A location of the other module interface connector 222' is illustrated by a dashed outline in FIG. 2B.

Further, according to some embodiments, the PXI instrumentation module 210 has a test signal input connector 216. For example, the test signal input connector 216 may be a coaxial connector 216 such as, but not limited to, a BNC connector, e.g., as illustrated in FIGS. 2A and 2B. In addition, the coaxial connector 216 may have a probe identification (ID) ring 216' located at a base of the coaxial connector 216. For example, the probe ID ring 216' may be coaxially located at a base of the BNC connector 216 adjacent to the PXI instrumentation module faceplate, as illustrated. For example, the probe ID ring 216' may be substantially similar to the probe ID ring found on an Infiniium 90000A DSO/DSA Series Oscilloscope, a product of Keysight Technologies, Inc. of Santa Rosa, Calif., USA.

According to some embodiments, the planar substrate 238 (e.g., PCB 238) of the active probe adapter 230 may have a through-hole from a first side to a second side thereof. The through-hole is configured to accommodate and fit over the test signal input connector 216 and the probe ID ring 216' of the PXI instrumentation module 210 to facilitate connection of the active probe at the test signal input connector 216. When connected, the active probe adapter planar substrate 238 is sandwiched between the active probe (not illustrated) and the PXI instrumentation module faceplate. Further, in some examples, the planar substrate 238 has a thickness that may be less than a thickness of the probe ID ring 216' to facilitate access to the probe ID ring 216' through the through-hole of the active probe adaptor planar substrate 238 by both a passive probe configured to connect to the coaxial connector 216 and the active probe, according to some embodiments.

In some embodiments of the principles described herein, a method of adapting an active probe to a PXI instrumentation module is provided. In particular, according to some embodiments, the method of adapting an active probe to a PXI instrumentation module may allow an active probe having a form factor or interface configuration that is incompatible with (e.g., wider than) the PXI instrumentation module to be used with PXI instrumentation module. Further, the method of adapting an active probe may facilitate using of an external power source (e.g., in a PXI power module) to provide power to the active probe, according to some embodiments.

Figure 3:
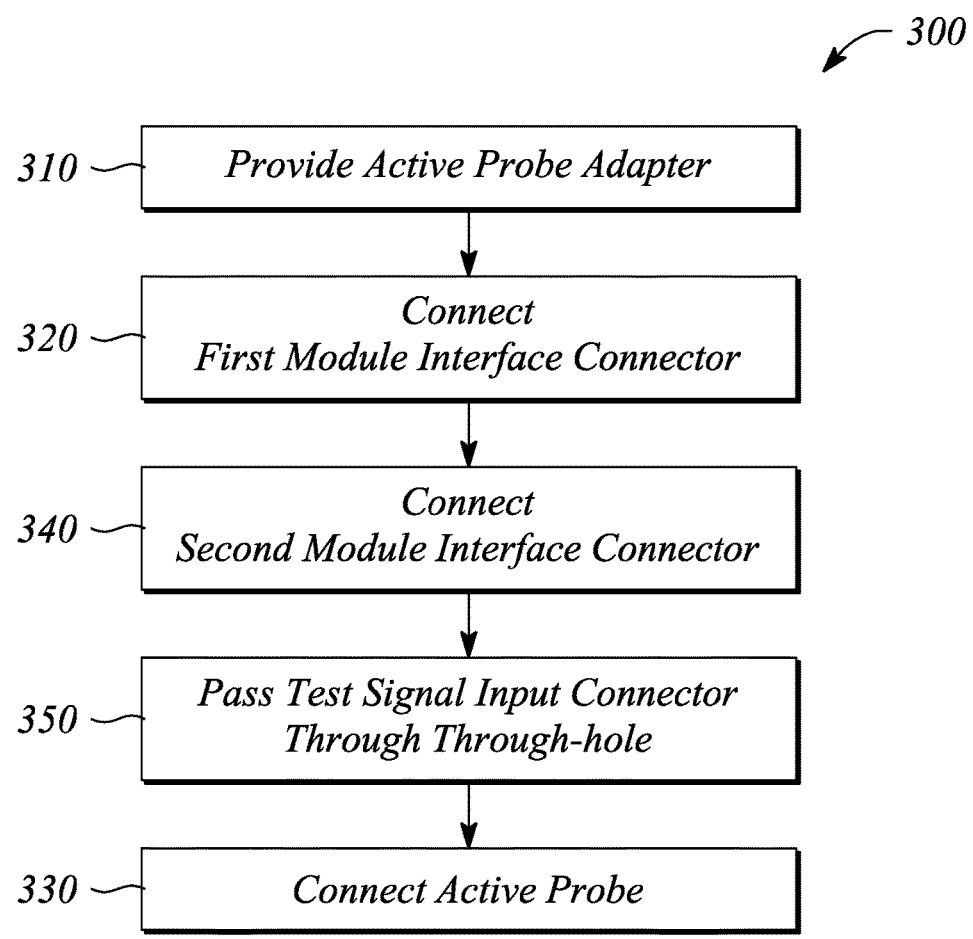
FIG. 3 illustrates a flow chart of a method of adapting an active probe to a PXI instrumentation module in an example, according to an embodiment of the principles describe herein.

FIG. 3 illustrates a flow chart of a method 300 of adapting an active probe to a PXI instrumentation module in an example, according to an embodiment of the principles describe herein. As illustrated, the method 300 comprises providing 310 an active probe adapter that is substantially planar and that has a first module interface connector on a first side and a plurality of probe pads on a second side opposite to the first side of the active probe adapter. According to some embodiments, the provided 310 active probe adapter may be substantially similar to the active probe adapter 100 described above. In particular, the first module interface connector may be substantially similar to the first MI connector 110 and the plurality of probe pads may be substantially similar to the plurality of probe pads 120, described above with respect to the active probe adapter 100. Moreover, in some embodiments, the active probe adapter further has a second module interface connector on the first side. The second module interface connector may be substantially similar to the second MI connector 130 of the above-describe active probe adapter 100.

According to some embodiments, the provided 310 substantially planar active probe adapter comprises a planar substrate such as, but not limited to, a printed circuit board (PCB) that is substantially similar to either the planar substrate 238 of the active probe adaptor 230 of the PXI instrumentation system 200 or the planar substrate (e.g., PCB) of the active probe adapter 100, described above. For example, the active probe adaptor planar substrate includes interconnection circuitry to electrically connect to together the probe pad plurality and the first and second module interface connectors.

According to various embodiments and as illustrated in FIG. 3, the method 300 of adapting an active probe to a PXI instrumentation module further comprises connecting 320 the first module interface connector of the active probe adapter to a corresponding interface connector of the PXI instrumentation module. In some embodiments, the PXI instrumentation module to which the first module interface connector is connected 320 may be substantially similar to the PXI instrumentation module 210 of the PXI instrumentation system 200, described above. For example, the PXI instrumentation module may be a PXI oscilloscope module.

In another example, the PXI instrumentation module may be, but is not limited to, a PXI digitizer module.

As illustrated in FIG. 3, the method 300 of adapting an active probe to a PXI instrumentation module further comprises connecting 330 the active probe to a test signal input connector of the PXI instrumentation module. For example, the active probe may be one or more of the active probes described above with respect to the active probe adapter 100, and the test signal input connector may be a coaxial connector such as, but not limited to, a BNC connector. Connecting 330 the active probe may comprise connecting a BNC connector of the active probe to the BNC connector of the PXI instrumentation module, for example. According to various embodiments, connecting 330 the active probe further comprises contacting pins of the active probe to the plurality of probe pads of the active probe adapter. For example, contacting active probe pins may comprise pressing pogo pins of the active probe against the probe pad plurality of the active probe adapter to provide electrical contact therebetween.

In some embodiments of the method 300, power may be provided to one or both of the active probe and the PXI instrumentation module using the active probe adapter. In these embodiments, the method 300 of adapting an active probe to a PXI instrumentation module further comprises connecting 340 a second module interface connector of the active probe adapter to a corresponding interface connector of a PXI power module. The PXI power module is located adjacent to the PXI instrumentation module, for example in a PXI chassis. According to various embodiments, the PXI power module is configured to provide power to the active probe through the second module interface connector on the first side of the active probe adapter and the plurality of probe pads on the second side of the active probe adapter.

In some embodiments, the active probe adapter is or comprises a planar structure that fits against a faceplate of the PXI instrumentation module when the first module interface connector of the active probe adapter is connected 320 to the corresponding interface connector of the PXI instrumentation module. The active probe adapter has a through-hole to accommodate the test signal input connector of the PXI instrumentation module such that the test signal input connector is accessible for connection 330 with or to the active probe.

In particular, according to these embodiments, the method 300 of adapting an active probe adapter to a PXI instrumentation module may further comprise passing 350 a test signal input connector through a through-hole in the active probe adapter. In particular, when the active probe adapter comprises a planar substrate (e.g., a PCB), the through-hole may be a hole through the planar substrate from the first side to the second side of the active probe adapter. Passing 350 the test signal input connector through the through-hole is performed prior to connecting 330 the active probe, according to various embodiments. Once the test signal input connector is passed 350 through the through-hole and the active probe is connected 330, the active probe adapter comprising the planar substrate or PCB is sandwiched between the active probe and a faceplate of the PXI instrumentation module.

Thus, there have been described examples and embodiments of an active probe adapter, a PXI instrumentation system employing an active probe, and a method of adapting an active probe to a PXI instrumentation module that include an active probe adapter to interface an active probe to a PXI instrumentation module. It should be understood that the above-described examples are merely illustrative of some of the many specific embodiments and examples that represent the principles described herein. Clearly, those skilled in the art can readily devise numerous other arrangements without departing from the scope as defined by the following claims.

What is claimed is:

1. A peripheral component interconnect extensions for instrumentation (PXI) instrumentation system comprising:
   an active probe adapter configured to adapt a form factor of and provide an interface between a first active probe and one or both of a PXI instrumentation module and a PXI power module, wherein the active probe adapter comprises a planar substrate configured to be sandwiched between the first active probe and a faceplate of the PXI instrumentation module; and
   a PXI instrumentation module in a PXI chassis comprising a test signal input connector configured to connect with a first active probe, and the planar substrate comprises a through-hole from a first side to a second side of the planar substrate to accommodate the test signal input connector of the PXI instrumentation module to facilitate active probe accessibility to the test signal input connector, wherein the test signal input connector is coaxial connector having a probe identification (ID) ring located at a base of the coaxial connector, a thickness of the planar substrate being less than a thickness of the probe ID ring to facilitate access to the probe ID ring by both a passive probe configured to connect to the coaxial connector and the first active probe.

2. The PXI instrumentation system of claim 1, wherein the active probe adapter comprises:
   a first module interface (MI) connector on a first side of the active probe adapter, the first MI connector configured to connect to a corresponding interface connector of the PXI instrumentation module;
   a second MI connector on the first side of the active probe adapter, the second MI connector configured to connect to the PXI power module; and
   a plurality of probe pads on a second side of the active probe adapter opposite to the first side, the plurality of probe pads configured to interface with the first active probe.

3. The PXI instrumentation system of claim 2, wherein the plurality of probe pads are located in a direction toward the PXI power module and at a distance from a centerline of the PXI instrumentation module that is greater than about one half of a width of a faceplate of the PXI instrumentation module.

4. The PXI instrumentation system of claim 1, wherein the coaxial connector comprises a BNC connector and a probe identification (ID) ring coaxially located at the base of the BNC connector adjacent to the faceplate of the PXI instrumentation module.

5. The PXI instrumentation system of claim 1, wherein the PXI instrumentation module comprises one or both of a PXI oscilloscope module and a PXI digitizer module.

* * * * *